US011245325B2

(12) United States Patent
Karinca

(10) Patent No.: US 11,245,325 B2
(45) Date of Patent: Feb. 8, 2022

(54) COMPENSATION FILTER AND METHOD FOR ACTIVATING A COMPENSATION FILTER

(71) Applicant: TDK Electronics AG, Munich (DE)

(72) Inventor: Yasin Karinca, Giengen (DE)

(73) Assignee: TDK ELECTRONICS AG, Munich (DE)

(*) Notice: Subject to any disclaimer, the term of this patent is extended or adjusted under 35 U.S.C. 154(b) by 0 days.

(21) Appl. No.: 16/970,285

(22) PCT Filed: Jan. 14, 2019

(86) PCT No.: PCT/EP2019/050796
§ 371 (c)(1),
(2) Date: Aug. 14, 2020

(87) PCT Pub. No.: WO2019/158289
PCT Pub. Date: Aug. 22, 2019

(65) Prior Publication Data
US 2021/0075310 A1 Mar. 11, 2021

(30) Foreign Application Priority Data
Feb. 15, 2018 (DE) .......................... 102018103438.5

(51) Int. Cl.
*H02M 1/12* (2006.01)
*H02M 1/14* (2006.01)
(Continued)

(52) U.S. Cl.
CPC ................ *H02M 1/12* (2013.01); *H02H 1/04* (2013.01); *H02H 9/005* (2013.01); *H02M 1/15* (2013.01);
(Continued)

(58) Field of Classification Search
CPC ........ H02M 1/12; H02M 1/123; H02M 1/126; H02M 1/143
(Continued)

(56) References Cited

U.S. PATENT DOCUMENTS 4,591,963 A * 5/1986 Retotar ............... H02M 1/4258
363/17
5,831,842 A 11/1998 Ogasawara et al.
(Continued)

FOREIGN PATENT DOCUMENTS

DE        2854196 A1    6/1980
DE         154465 A3    3/1982
(Continued)

OTHER PUBLICATIONS

Chen Wenjie, Xu Yang, Zhaoan Wang, A Novel Hybrid Common-Mode EMI Filter With Active Impedance Multiplication, May 2011, IEEE Transactions on Industrial Electronics, IEEE Service Center, vol. 58, pp. 1826-1834 (Year: 2011).*
(Continued)

*Primary Examiner* — Gary A Nash
(74) *Attorney, Agent, or Firm* — Slater Matsil, LLP

(57) ABSTRACT

A compensation filter and a method for activating a compensation filter are disclosed. In an embodiment a compensation filter includes an operational amplifier, a capacitive element, a first and a second resistive element and a current converter. The compensation filter is configured to attenuate a common mode interference in a critical frequency range.

7 Claims, 3 Drawing Sheets

(51) Int. Cl.
  *H02H 1/04* (2006.01)
  *H02H 9/00* (2006.01)
  *H02M 1/15* (2006.01)
  *H03H 11/12* (2006.01)
(52) U.S. Cl.
  CPC .......... *H03H 11/126* (2013.01); *H02M 1/123* (2021.05); *H02M 1/126* (2013.01); *H02M 1/143* (2013.01)
(58) Field of Classification Search
  USPC .............................................. 363/39, 40, 44
  See application file for complete search history.

(56) References Cited

U.S. PATENT DOCUMENTS

| | | | | |
|---|---|---|---|---|
| 9,407,133 | B1* | 8/2016 | Alexander | H02M 7/797 |
| 2005/0280405 | A1* | 12/2005 | Bray | H02M 1/15 |
| | | | | 323/312 |
| 2010/0182100 | A1* | 7/2010 | Tucker | H02M 1/12 |
| | | | | 333/181 |
| 2013/0010506 | A1* | 1/2013 | Sakai | H02M 1/15 |
| | | | | 363/37 |
| 2014/0292401 | A1* | 10/2014 | Shen | H02M 1/15 |
| | | | | 327/556 |
| 2017/0179931 | A1 | 6/2017 | Tucker | |

FOREIGN PATENT DOCUMENTS

| | | | |
|---|---|---|---|
| DE | 102008024348 A1 * | 12/2009 | .............. H02H 9/08 |
| DE | 102008024348 A1 | 12/2009 | |
| DE | 102011078304 A1 | 1/2013 | |
| EP | 2945268 A1 * | 11/2015 | .............. H02M 1/12 |
| EP | 2963752 A2 | 1/2016 | |
| EP | 3113361 A1 | 1/2017 | |
| EP | 3208905 A2 | 8/2017 | |
| EP | 3255770 A1 | 12/2017 | |
| JP | 2010057268 A | 3/2010 | |
| WO | 2014048471 A1 | 4/2014 | |
| WO | WO-2014048471 A * | 4/2014 | .............. H02M 1/12 |

OTHER PUBLICATIONS

D. Y. Lee, et al., "Design of an Input Filter for Power Factor Correction (PFC) AC to DC Converters Employing an Active Ripple Cancellation," IEEE, Aug. 1996, 5 pages.

LEAKCOMP® HP, "Leakage current compensation," Apr. 2015, 10 pages.

Marcelo L. Heldwein, et al., "Implementation of a Transformerless Common-Mode Active Filter for Offline Converter Systems," IEEE Transactions on Industrial Electronics, vol. 57, No. 5, May 2010, 15 pages.

Satoshi Ogasawara, et al.,"An Active Circuit for Cancellation of Common-Mode Voltage Generated by a PWM Inverter," IEEE, Sep. 1998, 7 pages.

Wenjie Chen, et al., "A Novel Hybrid Common-Mode EMI Filter with Active Impedance Multiplication," IEEE Transactions on Industrial Electronics, vol. 58, No. 5, May 2011, 9 pages.

* cited by examiner

COMPENSATION FILTER AND METHOD FOR ACTIVATING A COMPENSATION FILTER

This patent application is a national phase filing under section 371 of PCT/EP2019/050796, filed Jan. 14, 2019, which claims the priority of German patent application 102018103438.5, filed Feb. 15, 2018, each of which is incorporated herein by reference in its entirety.

TECHNICAL FIELD

The invention relates to compensation filters, for example for suppressing interference signals such as leakage currents, and methods for activating a corresponding compensation filter.

BACKGROUND

Electric currents that flow in power lines for the supply of electric consuming units can be divided generally into three categories. Firstly, currents may flow that serve the usual purpose, for example for driving a motor or the like. Currents that are to be attributed to a malfunction can also flow. It is, for example, unwanted but possible that a housing of a consuming unit is connected to a current-carrying cable. If, for example, a user touches the housing, a corresponding current would flow through the user. To protect the user from corresponding electric shocks, it is possible to connect a fault current circuit breaker (FI switch) between an energy source and the electric consuming unit. The fault current circuit breaker would ascertain a flow of current via a corresponding unwanted path, and disconnect the electric consuming unit from the energy source. A third category of currents concerns the leakage currents of electric consuming units. A leakage current is an electric current which, under usual operating conditions, flows in an unwanted current path, and differs from the unwanted currents of the second category in that the leakage current is in some circumstances necessary for a correct functioning of the electric consuming unit as, for example, in an EMC filter or a frequency converter.

Leakage currents of this type are largely not dangerous for users, but can lead to problems in equipment with fault current circuit breakers, e.g. fault current circuit breakers. Leakage currents can, in particular, trigger fault current circuit breakers, and thus heavily impair the reliability of the equipment. A circuit is therefore wanted that increases the reliability of an electric consuming unit which is, for example, downstream from a fault current circuit breaker.

Filter circuits are known from European Patent Application No. EP 3 113 361 A1 which can reduce a leakage current.

It is furthermore possible to prevent an unintentional triggering of fault current circuit breakers by leakage currents through the use of isolating transformers. A galvanic isolation has the effect that the leakage current flows almost exclusively on the secondary side of the isolating transformer, and is thus not detected by the fault current circuit breaker that is positioned on the primary side. As a result of a few disadvantages, however, the use of isolating transformers is not wanted. At larger rated currents the physical size increases significantly, so that the isolating transformer is large and difficult to build. For mobile electric consuming units above all, this can be a criterion for exclusion. High power losses and associated high temperatures are further unwanted consequences of isolating transformers.

It is furthermore possible to use a mains supply line with a permanent connection. It is, for example, then possible to omit a fault current circuit breaker. The big disadvantage here is that the associated connected electric consuming units are not mobile.

SUMMARY

Embodiments provide circuits for reducing interference, in particular common mode interference such as leakage currents. Further embodiments provide circuits that compensate for them, that electric consuming units that are, in principle, problematic can be used without a permanent connection.

A condensation filter comprises for this purpose a first port, a second port and a power line between the first port and the second port. The compensation filter furthermore has an operational amplifier with an input and an output. The compensation filter additionally has a capacitive element that is coupled between the first port and the output of the operational amplifier, and has the capacitance $C_o$. The compensation filter further has a first resistive element that is coupled between the capacitive element and the output of the operational amplifier, and has the electrical resistance $R_o$. The filter further has a current converter which is coupled in parallel with the capacitive element, and which couples the power line to the input of the operational amplifier. A second resistive element of the compensation filter is coupled between the capacitive element and the input of the operational amplifier, and has the resistance $R_B$. The compensation filter attenuates a common mode interference in a critical frequency range.

It is possible that the compensation filter for a common mode interference in the power line transfers a compensation signal of the same frequency, same amplitude and opposite arithmetic sign to the power line.

It is possible that the compensation filter is connected electrically between an energy source and at least one electrically active element of an electric consuming unit. It is in particular possible that a fault current circuit breaker is connected between the energy source and the compensation filter. Interference that is unavoidable, for example for the operation of the electric consuming unit, but which can in some circumstances trigger a fault current circuit breaker, is neutralized by the provision of a current path with a corresponding compensation signal of the compensation filter, or at least weakened sufficiently far that the electric consuming unit can be operated without difficulty behind a fault current circuit breaker. It is in this way possible to omit a permanent connection. The electric consuming unit can be connected to the energy source via an electrical coupling, for example an electric plug in an electric socket, and disconnected from the energy source.

It is possible that the critical frequency range in which the compensation filter attenuates the common mode interference sufficiently strongly comprises frequencies between one kilohertz and 300 kilohertz. It is further possible that the critical frequency range also comprises frequencies below one kilohertz. It is accordingly possible that the critical frequency range starts at about 150 hertz.

Typical electric consuming units can be connected to an energy source that provides a mains current with a frequency of 50 or 60 hertz. In order to ensure the protection of users of the electric consuming unit, a common mode current of the mains voltage, e.g. 50 hertz or 60 hertz, must not be attenuated. The appropriate fault current circuit breaker must be able to recognize fault currents with the mains frequency, e.g. 50 hertz or 60 hertz, reliably. This frequency range must therefore not be part of the critical frequency range within which the compensation filter attenuates interference. It is therefore advantageous that the critical frequency range starts above 50 hertz or above 60 hertz. The lower limit of the critical frequency range is determined here by the values of the capacitance $C_o$, of the first resistive element $R_o$ and of the second resistive element $R_B$. $C_o$, $R_o$ and $R_B$ are accordingly chosen such that the lower limit is obtained at a frequency of 50 hertz or higher, preferably 100 hertz or 150 hertz.

The following must be observed here: the compensation filter reacts to common mode interference. The number of electrical conductors in the power line here can be greater than 1 and can, for example, be 3. It is also possible to use electric consuming units that work with one phase, with two phases or with three phases. The compensation filter can be coupled to the energy source at the first port. The first port sees, in effect, the mains impedance. The second port can be coupled to the electric consuming unit, and sees its impedance or the impedance of a converter system connected in between. The converter system can, for example, be one of a plurality of sources of the common mode interference. If the interference signal corresponds to a leakage current $I_N$, then a compensation current $I_o$ is preferably generated in phase opposition and output to the power line, that the resulting current $I_N$ corresponds to the expected current, e.g. of the fault current circuit breaker.

The capacitive element with the capacitance $C_o$ here represents the mains connection that connects the mains to the electronics of the compensation filter. The heart of the electronics is formed by the operational amplifier. The operational amplifier is part of a voltage follower. When the leakage current $I_N$ flows through a primary side of the current converter, this current is transferred to the secondary side of the current converter with a phase shift of 180°. The current flows here through the second resistive element which can, for example, represent a burden resistor, and thus generates the input voltage of the operational amplifier. The amplification factor of the operational amplifier can, for example, be 1. The input voltage is then transferred 1:1 to the first resistive element with the resistance $R_o$. The compensation current $I_o$ is thus generated by the voltage drop at the first resistive element: $I_o = U_o : R_o$.

The values of the electric components are accordingly selected such that a frequency characteristic is obtained, so that the attenuation is sufficiently high even at frequencies below one kilohertz, in order to prevent a triggering of a fault current circuit breaker. At the same time, the selectivity of the frequency characteristic at frequencies in the range of 50 hertz or 60 hertz is retained in such a way that attenuation does not occur.

It is possible that at frequencies close to the mains frequency, even an overshoot is received by the compensation filter. This means that a corresponding signal is not only not attenuated, but that it is even amplified. Such an overshoot is, however, not problematic, and in particular does not present a technical safety problem. The personal safety of the user is provided.

It is accordingly possible that the critical frequency range starts above a mains frequency.

The mains frequency can here be 50 hertz or 60 hertz. It is accordingly possible that the common mode interference contains a leakage current or consists of a leakage current It is further possible that the capacitance $C_o$ is so large that leakage currents even below one kilohertz are compensated for.

A voltage drop occurs at the capacitors when a leakage current is compensated for and thus flows through one or a plurality of coupling capacitors. So that the compensation current $I_o$ always remains correct, it would be advantageous if the operational amplifier also takes this voltage drop into account in the control of the output voltage. The greater the magnitude of this voltage drop at the coupling capacitor, the greater is the magnitude of the coupling voltage $V_o$ that belongs to the coupling current. This means that the operational amplifier can be overdriven if the voltage drop at the coupling capacitor becomes too high. This suggests keeping the impedance of the coupling capacitor as small as possible.

In contrast to the intuitive selection of a small capacitance value $C_o$, the compensation filter however preferably has a large coupling capacitance $C_o$. The lower frequency limit of the critical range can in this way be shifted towards lower frequencies.

It is possible that the compensation filter comprises a power supply connection that is disconnected from the power line.

The compensation filter uses electronic components to generate the compensation current. The electronic components such as the operational amplifier here are electric components that themselves are electric consuming units. The compensation filter has the power line that can be connected to an energy source. This would therefore suggest establishing the energy supply of the electronics of the compensation filter through a connection to the power line.

In contrast to this intuitive method of supplying the electronics of the compensation filter with energy, it is however proposed that the compensation filter comprises a power supply connection, in particular for supply of the electronic components, which is separate from the power line.

It was recognized that a compensation filter in which the electronics are fed with energy directly from the power line cannot always reliably ensure triggering of a fault current circuit breaker. If, however, circuit components of the compensation filter are supplied with electric energy from an external energy supply, a triggering of a fault current circuit breaker can be prevented reliably.

The compensation filter is preferably supplied with electric energy for this purpose before the compensation filter is connected between an energy source and the electric consuming unit. The electronics of the compensation filter is thereby brought into operation earlier, and transient response processes of the electronic components can be finished before the compensation filter has to begin its work.

The aspect of the anticipatory property of the energy supply of the electronic components is in particular important for the compensation of leakage currents with low frequency, e.g. below one kilohertz. It is ensured in this way that the electronics attenuate the leakage currents quickly enough before the fault current circuit breaker can detect these currents.

A switch-mode power supply, for example, which supplies the operational amplifier with electrical energy is a critical point, since the output voltage can, for example, take longer than 100 milliseconds to settle.

It is possible to supply the electronics of the compensation filter with an operating voltage of 400 volts AC.

It is possible to ensure through the external energy supply that the output voltage of the switch-mode power supply for the electronics is reached before the leakage currents flow. The switch-mode power supply for the electronics can, for example, reduce the energy of the external voltage from 400 volts to an operating voltage for the electronics of about 60 volts. The DC operating point of an operational amplifier can, for example, be 30 volts.

The electronics of the compensation filter are in a steady state before leakage currents flow.

It is possible that the current converter comprises magnetically coupled inductive elements. A first inductive element can here be connected in a conductor of the power line or coupled with a part of a conductor of the power line. A second part of the current converter can here be connected to the first part of the current converter, and itself in turn be connected to or coupled with the electronics of the compensation filter.

It is possible that on the primary side the current converter comprises at least one inductive element for each conductor of the power line.

It is possible that the power line comprises conductors for one, two or three phases in the power line.

It is possible that the power line comprises conductors for three phases, that the conductors are coupled via a neutral point to the operational amplifier, and the neutral point is coupled to the respective conductor for each phase via a parallel interconnection of a capacitive element and a resistive element.

Embodiments provide a method for activating a compensation filter. The compensation filter with its own power supply connection can be designed such that the power supply connection is connected to an energy source before the compensation filter is connected between a consuming unit and an energy source.

The energy source that connects the compensation filter to the consuming unit can here be identical to the energy source for the power supply connection. It is, however, also possible, that the power supply connection of the compensation filter and the consuming unit use different energy sources.

BRIEF DESCRIPTION OF THE DRAWINGS

Important aspects and details of concrete forms of embodiment are explained in more detail with reference to the schematic figures.

DETAILED DESCRIPTION OF ILLUSTRATIVE EMBODIMENTS

Figure 1:
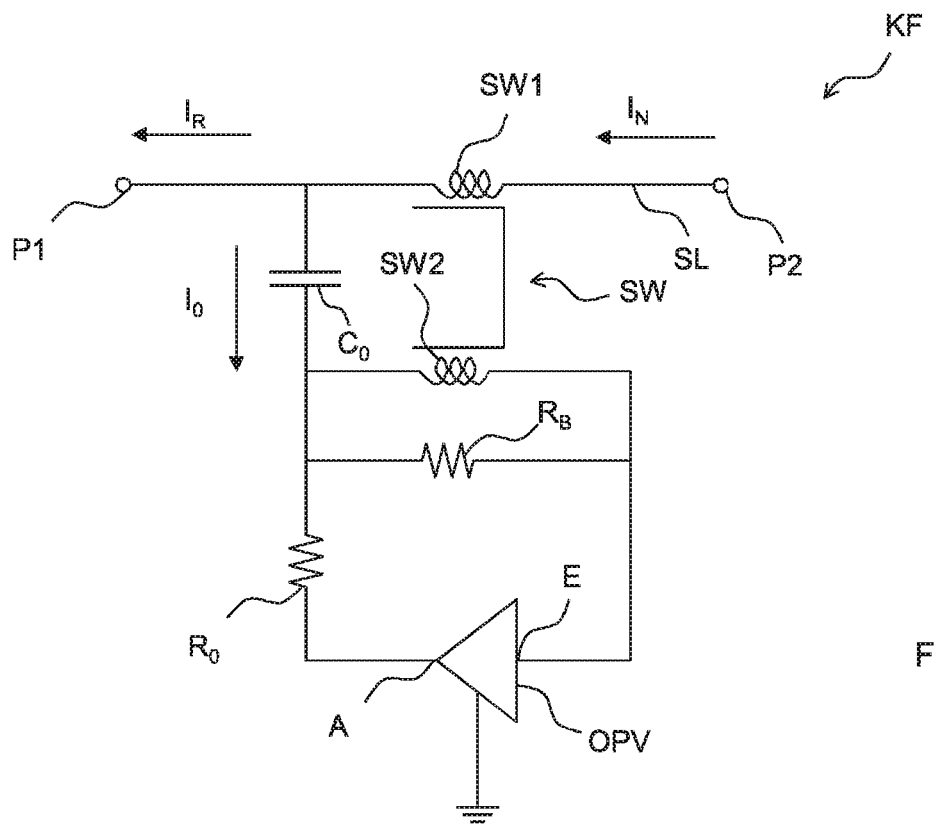
FIG. 1 shows an equivalent circuit diagram that explains the mode of operation of the compensation filter.

FIG. 1 shows an equivalent circuit diagram of a possible circuit topology of the compensation filter KF. The compensation filter KF has a first port P1 and a second port P2. A power line SL is connected between the first port P1 and the second port P2. The compensation filter further has an operational amplifier OPV. The operational amplifier has an input E and an output A. The coupling capacitance, i.e., the capacitive element with the capacitance $C_o$, is connected between the power line SL and the output A of the operational amplifier. The first resistive element $R_o$ is connected between the coupling capacitance and the output A of the operational amplifier OPV. A current converter SW is connected in parallel with the coupling capacitance $C_o$. The current converter SW has a first inductive element SW1 and a second inductive element SW2. The first inductive element SW1 is arranged at the primary side of the current converter SW and is connected in the power line SL or at least coupled with the power line SL. The second inductive element SW2 of the current converter SW is arranged at the secondary side of the current converter SW and is coupled to the input E of the operational amplifier. The second inductive element SW2 of the current converter SW is connected in parallel with the second resistive element $R_B$. The second resistive element $R_E$ is connected in series between the coupling capacitance $C_o$ and the input E of the operational amplifier OPV.

$I_N$ represents the complete interference, e.g. the complete leakage current. $I_o$ is the compensation current that is determined by the operational amplifier OPV and the additional circuit elements $C_o$, $R_E$ and $R_o$. The arithmetic sign, frequency and the amplitude of the compensation current $I_o$ are preferably selected such that a current path provided by the amplifier is generated, so that preferably no leakage current, or at most a small, residual leakage current IR can be detected at the first port $P_1$. The compensation filter can be connected to an external energy source or to a fault current circuit breaker between the energy source and the compensation filter via the first port P1. The compensation filter can be connected to an electric consuming unit via the second port P2.

Figure 2:
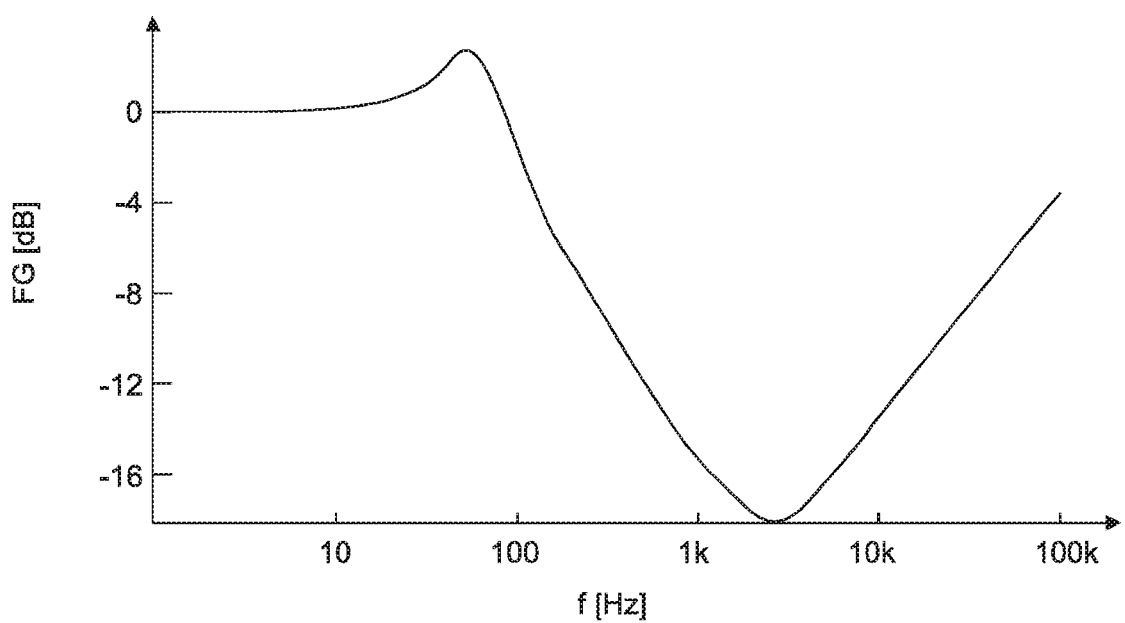
FIG. 2 shows a preferred frequency characteristic of the compensation filter.

FIG. 2 shows a preferred frequency characteristic FG of the compensation filter. The critical frequency range is, for example, defined such that attenuation values of 10 dB specify the lower and upper limits of the frequency range.

FIG. 2 correspondingly shows a critical frequency range from 150 hertz up to 30 kilohertz. The overshoot at frequencies just under 100 hertz effectively represent a signal amplification. This is not, however, problematic, and does not present either a functional or a technical safety problem.

Figure 3:
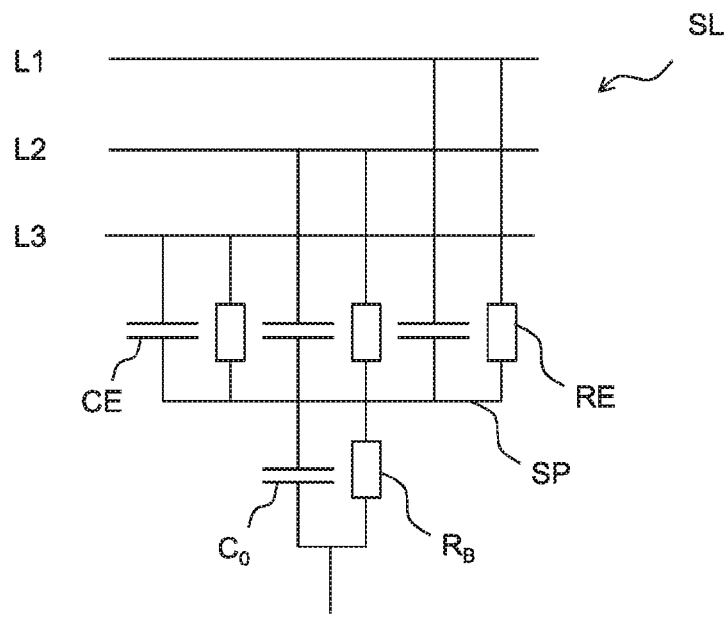
FIG. 3 shows the coupling to a three-phase line.

FIG. 3 illustrates how a coupling to a power line with three phases is possible. The symmetry point of the three phases is obtained at the neutral point SP. The neutral point SP is connected in each case by a parallel circuit of a capacitive element CE and a resistive element $R_B$ to the respective conductor L1, L2, L3 and the power line SL. The neutral point SP is connected at the output through a parallel interconnection comprising the coupling inductance Co and the second resistive element $R_B$ to the rest of the compensation circuit (not shown here).

The interference to be compensated for here is a common mode interference. This means an interference that acts additively on the amplitude, frequency and phase of all the conductors L1, L2, L3 of the power line SL. It is therefore enough to have the electronics of the compensation filter act on the neutral point SP of the power line SL.

Figure 4:
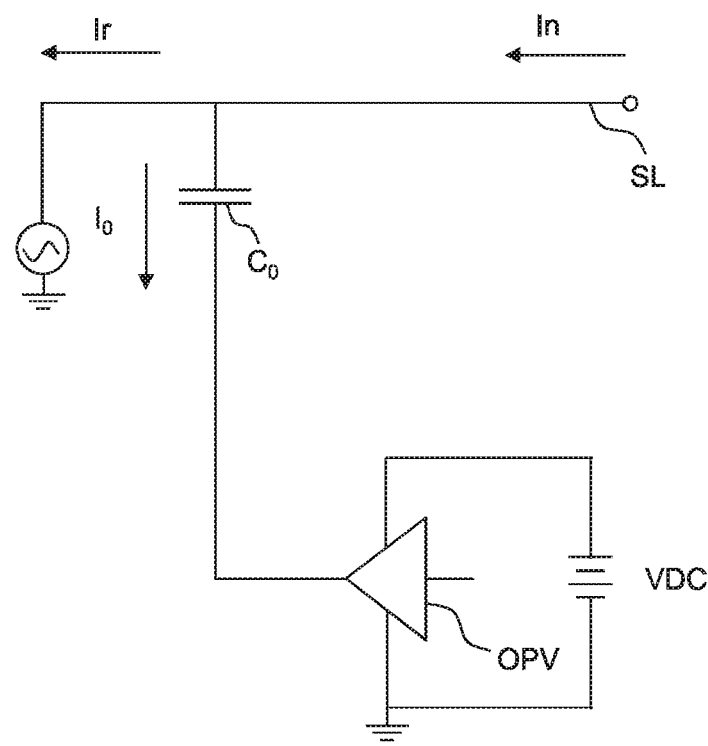
FIG. 4 shows an equivalent circuit diagram for determining an appropriate magnitude of the coupling capacitance.

FIG. 4 shows an equivalent circuit diagram that advantageously helps to determine the value of the coupling capacitance $C_o$. The mains connection is realized through the one coupling capacitor or a plurality of coupling capacitors. A voltage drop occurs at the capacitors when a leakage current is compensated for and thus flows through the one coupling capacitor or a plurality of coupling capacitors. So that the compensation current $I_o$ always remains correct, the operational amplifier must also take the associated voltage drop at the coupling capacitor into account in the control of the output voltage. In order to be able to compensate also for leakage currents with a frequency below one kilohertz, coupling capacitors with a greater capacitance than is usually known are necessary in order to obtain a lower impedance and thus a smaller voltage drop.

Figure 5:
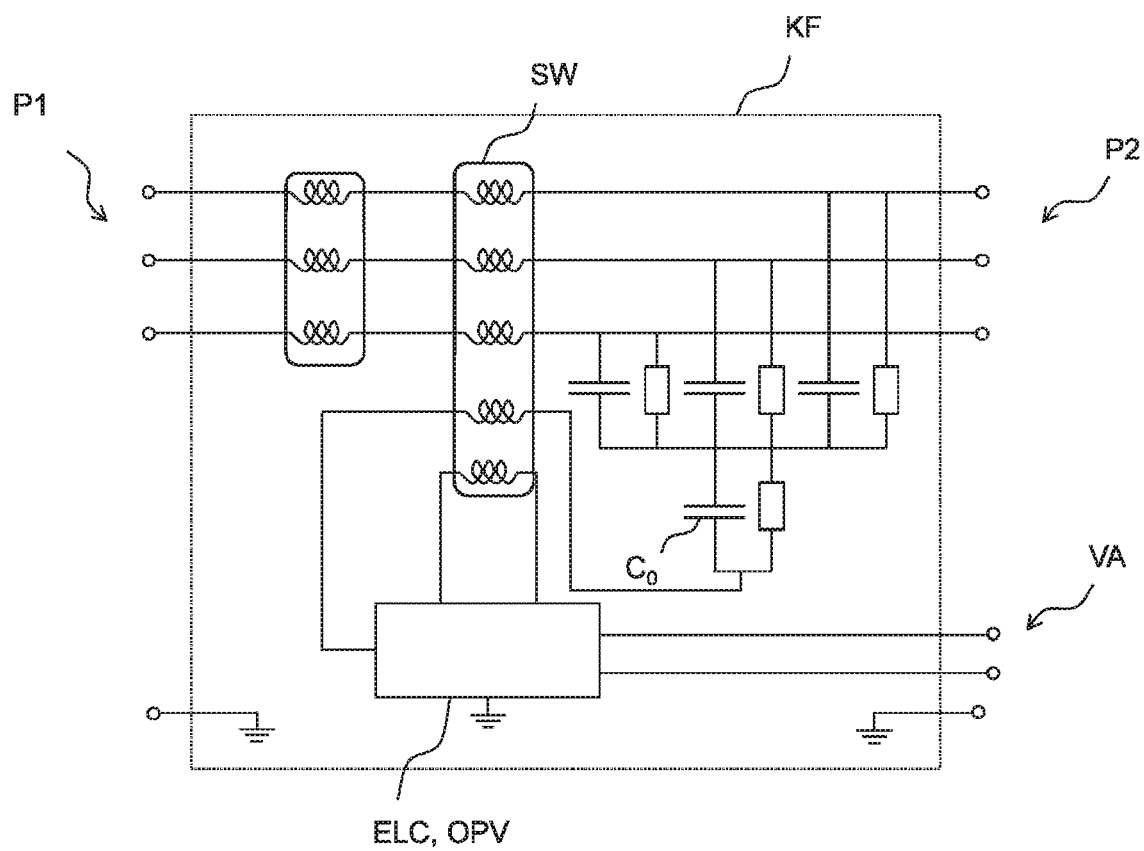
FIG. 5 shows a form of embodiment of the compensation filter with an external power supply connection.

FIG. 5 illustrates the possibility of supplying the electronic circuit components ELC, e.g. the operational amplifier OPV, with electric energy via an external power supply connection VA. Electric energy is here strictly not taken from the power line. Through this it is possible to supply the electronic circuit components ELC with electrical energy and to wait for transient response processes before the compensation filter KF starts its work, i.e., before the compensation filter connects an electric consuming unit to an external energy source.

Figure 6:
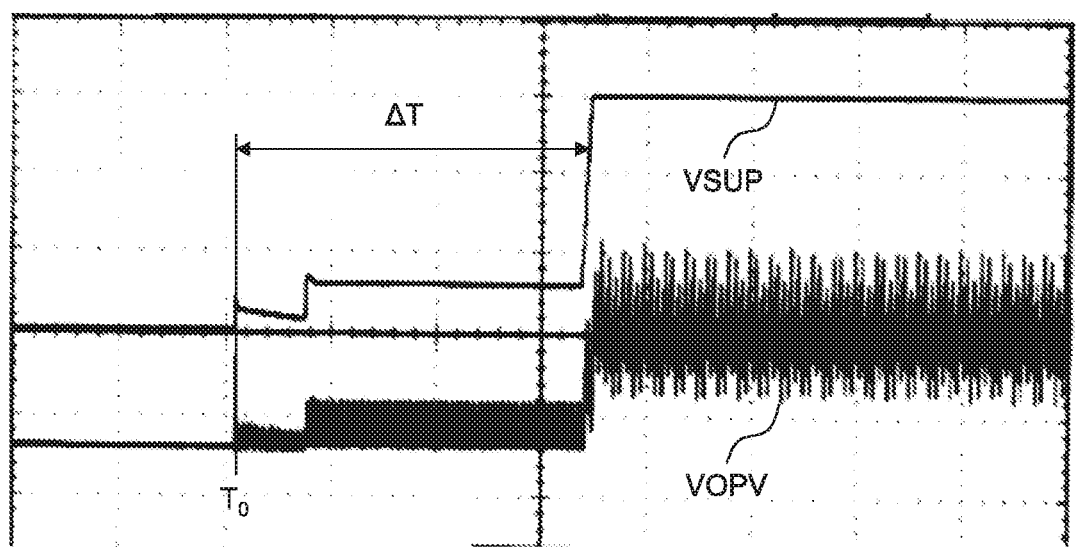
FIG. 6 shows the effect of a delayed connection between an energy source and a consuming unit.

The temporal sequence associated with this is shown in FIG. 6. The upper curve VSUP represents the temporal sequence of the supply voltage of the electric circuit components ELC of the compensation filter KF. The lower curve VOPV shows the output signal of the operational amplifier. The electronic circuit components are supplied with energy at the time $T_o$. It takes a certain time $\Delta T$ here until the supply voltage has reached the correct value. The operational amplifier takes up its type as soon as a supply voltage is made available to it. It does, however, only achieve its greatest effectiveness at the time point $T_o$ plus $\Delta T$ at which the supply voltage VSUP has reached its intended value.

If the compensation filter were required before the operation filter is working in the desired manner, it is possible that leakage currents or other interference signals would not be fully compensated for, and an unintentional actuation of a fault current circuit breaker can be the result.

Because the compensation filter receives its own supply voltage at the power supply connection VA, preferably in such a way that this occurs before functioning of the filter is wanted, transient response processes can take place. As soon as the compensation filter is working as desired, it can be connected to the first and to the second port between an energy source and a consuming unit.

The time delay $\Delta T$ can here lie in the order of magnitude of 100 milliseconds.

The compensation filter and the method for activating a compensation filter are here not restricted to the technical details that are illustrated and described. The compensation filter can comprise further circuit components such as for example further coupling capacitors and further electronic circuit components. The method can comprise additional steps e.g. in relation to the connection to the external energy source or the connection to the consuming unit.

The invention claimed is:

1. A compensation filter comprising:
    a first port;
    a second port;
    a power line between the first port and the second port;
    an operational amplifier with an input and an output;
    a capacitive element coupled between the first port and the output of the operational amplifier, wherein the capacitive element has a capacitance value;
    a first resistive element coupled between the capacitive element and the output of the operational amplifier, wherein the first resistive element has a first resistance value;
    a current converter coupled in parallel with the capacitive element, wherein the current converter couples the power line to the input of the operational amplifier;
    a second resistive element coupled between the capacitive element and the input of the operational amplifier, wherein the second resistive element has a second resistance value; and
    a power supply connection separate from the power line,
    wherein a critical frequency range starts above a mains frequency,
    wherein the capacitance value is sufficiently large so that leakage currents below 1 kHz are compensated for, and
    wherein the compensation filter is configured to attenuate a common mode interference in the critical frequency range.

2. The compensation filter according to claim 1, wherein the compensation filter is configured to transmit a compensation signal with the same frequency, the same amplitude and an inverse arithmetic sign to the power line when the common mode interference in the power line occurs.

3. The compensation filter according claim 1, wherein the common mode interference contains a leakage current.

4. The compensation filter according to claim 1, wherein the current converter comprises magnetically coupled inductive elements.

5. The compensation filter according to claim 1, wherein the power line comprises conductors for one, two or three phases.

6. The compensation filter according to claim 1,
    wherein the power line comprises conductors for three phases,
    wherein the conductors are coupled via a neutral point to the operational amplifier,
    wherein the neutral point is coupled to a respective conductor for each phase through a parallel interconnection of a capacitive element and a resistive element.

7. A method for activating the compensation filter according to claim 1 with a power supply connection, the method comprising:
    connecting the power supply connection to an energy source before the compensation filter is connected between a consuming unit and the energy source.

* * * * *